United States Patent
Tan et al.

(10) Patent No.: US 10,842,029 B2
(45) Date of Patent: Nov. 17, 2020

(54) ELECTRONIC DEVICE AND METHOD FOR MANUFACTURING THE SAME

(71) Applicant: Jabil Circuit (Guangzhou) Ltd., Guangzhou (CN)

(72) Inventors: Jiangang Tan, Guangzhou (CN); Jingmin Liang, Guangzhou (CN)

(73) Assignee: Jabil Circuit (Guangzhou) Ltd., Guangzhou (CN)

( * ) Notice: Subject to any disclaimer, the term of this patent is extended or adjusted under 35 U.S.C. 154(b) by 0 days.

(21) Appl. No.: 16/558,449

(22) Filed: Sep. 3, 2019

(65) Prior Publication Data

US 2020/0077524 A1  Mar. 5, 2020

(30) Foreign Application Priority Data

Sep. 3, 2018 (CN) .......................... 2018 1 1019522

(51) Int. Cl.
| | |
|---|---|
| *H05K 7/00* | (2006.01) |
| *H05K 3/34* | (2006.01) |
| *H05K 1/11* | (2006.01) |
| *H05K 1/18* | (2006.01) |

(52) U.S. Cl.
CPC .......... *H05K 3/3421* (2013.01); *H05K 1/115* (2013.01); *H05K 1/184* (2013.01)

(58) Field of Classification Search
USPC ........................................................ 361/760
See application file for complete search history.

(56) References Cited

U.S. PATENT DOCUMENTS

2013/0100628 A1*  4/2013  Yamaguchi .......... H01R 12/585
361/792

\* cited by examiner

*Primary Examiner* — Andargie M Aychillhum
(74) *Attorney, Agent, or Firm* — Young Basile Hanlon & MacFarlane, P.C.

(57) ABSTRACT

An electronic device includes a circuit board and an electronic element. The circuit board includes a plate body and multiple through holes extending through the plate body. Each of the through holes has a first diameter. The electronic element includes multiple pins, each of which is inserted into a respective one of the through holes, is secured to the circuit board by a soldering process, and has a second diameter smaller than the first diameter of the respective one of the through holes. For each of the pins, a difference between the second diameter of the pin and the first diameter of the respective one of the through holes ranges from 0.4 mm to 0.6 mm. A method for manufacturing the electronic device is also provided.

12 Claims, 7 Drawing Sheets

```
S1: providing a circuit board including a plate body and a plurality of through holes
    extending through the plate body, each of the through holes having a first diameter S2: providing an electronic element including a plurality of pins, each of which has a
    second diameter, wherein the second diameter of each of the pins is smaller than
    the first diameter of a respective one of the through holes, and wherein, for each of
    the pins, a difference between the second diameter of the pin and the first diameter
    of the respective one of the through holes ranges from 0.4 mm to 0.6 mm S3: inserting each of the pins of the electronic element into the
    respective one of the through holes of the circuit board S4: securing the pins of the electronic element
    to the circuit board by a soldering process
```

ELECTRONIC DEVICE AND METHOD FOR MANUFACTURING THE SAME

CROSS-REFERENCE TO RELATED APPLICATION

This application claims priority of Chinese Invention Patent Application No. 201811019522.0, filed on Sep. 3, 2018.

FIELD

The disclosure relates to an electronic device, more particularly to an electronic device including a circuit board and a plurality of pins soldered to the circuit board, and a method for manufacturing the electronic device.

BACKGROUND

Wave soldering is one of the conventional techniques for assembling electronic devices. FIG. 1 is a schematic view showing a wave soldering process for assembling an electronic device 10. The electronic device 10 includes a circuit board 1 that is formed with a plurality of through holes 11, and a plurality of electronic elements 2 that are disposed on the circuit board 1. Each of the electronic elements 2 includes a plurality of pins 21, each of which is inserted in a corresponding one of the through holes 11. In the wave soldering process, after flux spray and pre-heating treatment, the electronic device 10 passes across a molten solder 4 contained in a tank 3 such that the molten solder 4 flows along the pins 21 into the through holes 11. Thereafter, the molten solder 4 in the through holes 11 of the circuit board 1 is cured by cooling to form a plurality of solder joints 4' (only one is shown in FIG. 2). However, voids 41' might be formed in the solder joints 4' due to gas that is trapped in the molten solder 4 in the through holes 11 (see FIG. 2). Such voids 41' might cause poor connection of the electronic elements 2 and the circuit board 1, which significantly influences the reliability of the thus assembled electronic device 10.

SUMMARY

Therefore, an object of the disclosure is to provide an electronic device that can alleviate at least one of the drawbacks of the prior art.

According to one aspect of the present disclosure, an electronic device includes a circuit board and an electronic element. The circuit board includes a plate body and a plurality of through holes extending through the plate body. Each of the through holes has a first diameter. The electronic element includes a plurality of pins. Each of the pins is inserted into a respective one of the through holes, is soldered to the circuit board, and has a second diameter smaller than the first diameter of the respective one of the through holes. For each of the pins, a difference between the second diameter and the first diameter of the respective one of the through holes ranges from 0.4 mm to 0.6 mm.

According to another aspect of the disclosure, a method for manufacturing an electronic device, comprising the steps of: providing a circuit board including a plate body having a first surface and a second surface that is opposite to the first surface, and a plurality of through holes extending from the first surface to the second surface, each of the through holes having a first diameter; providing an electronic element including a plurality of pins, each of the pins having a second diameter smaller than the first diameter of a respective one of the through holes, for each of the pins, a difference between the second diameter of the pin and the first diameter of the respective one of the through holes ranging from 0.4 mm to 0.6 mm; inserting each of the pins of the electronic element into the respective one of the through holes; and securing the pins of the electronic element to the circuit board by a soldering process.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Figure 1:
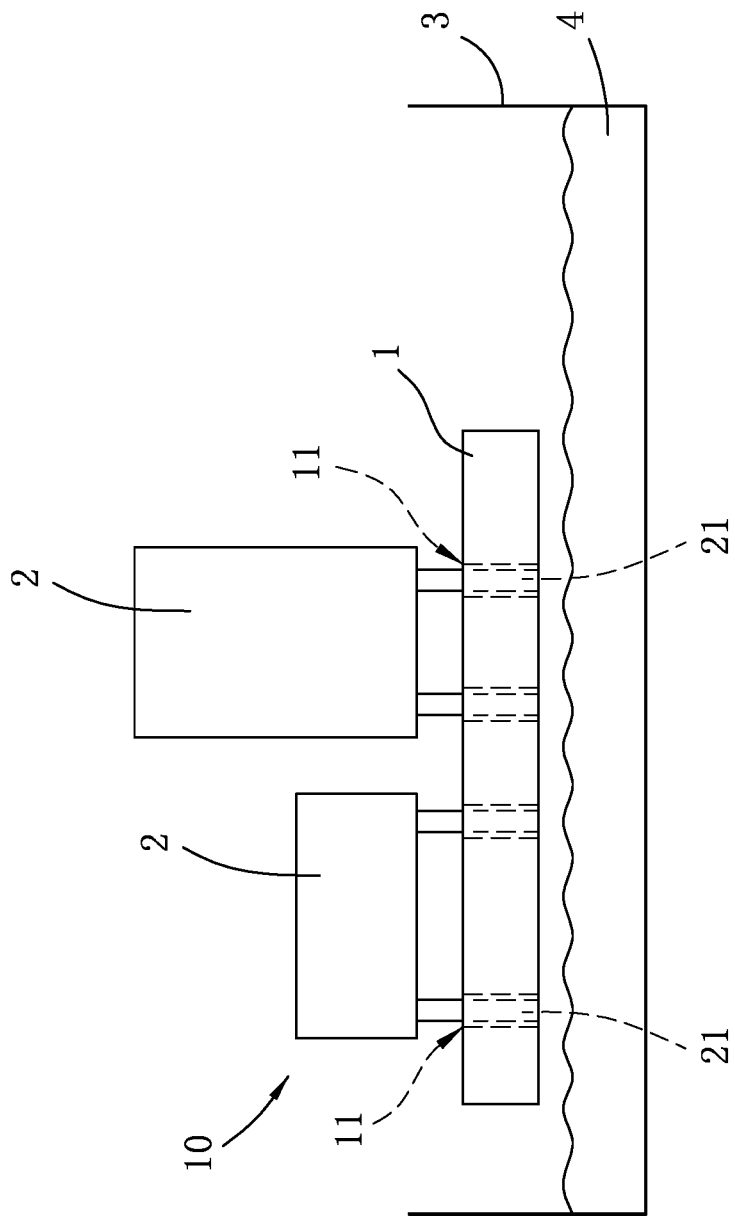
FIG. 1 is a schematic view showing a wave soldering process for making a conventional electronic device.
Figure 2:
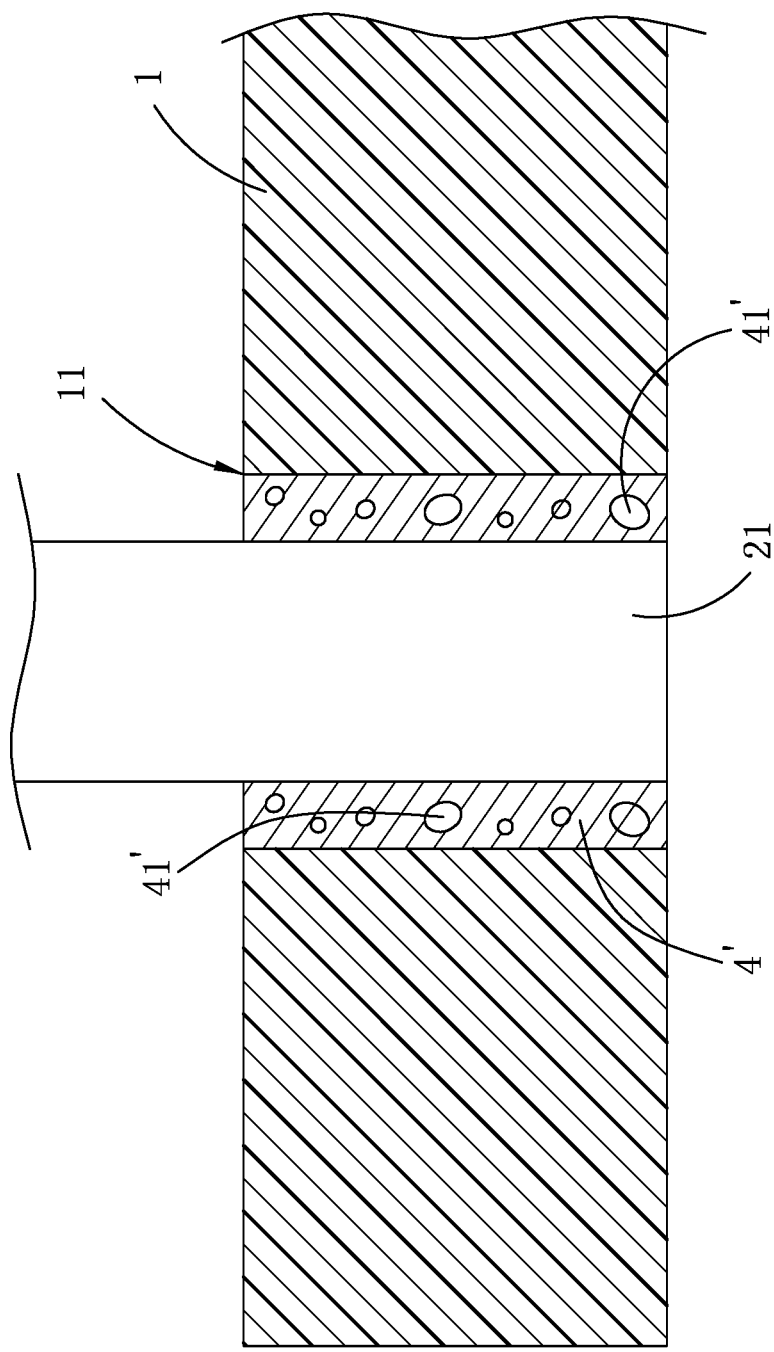
FIG. 2 is a partly and fragmentary sectional view of the conventional electronic device with a plurality of voids formed therein.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIGS. 3 to 6, an embodiment of an electronic device 5 and a method for manufacturing the embodiment of the electronic device 5 are illustrated. The method includes steps S1 to S4.

Figure 3:
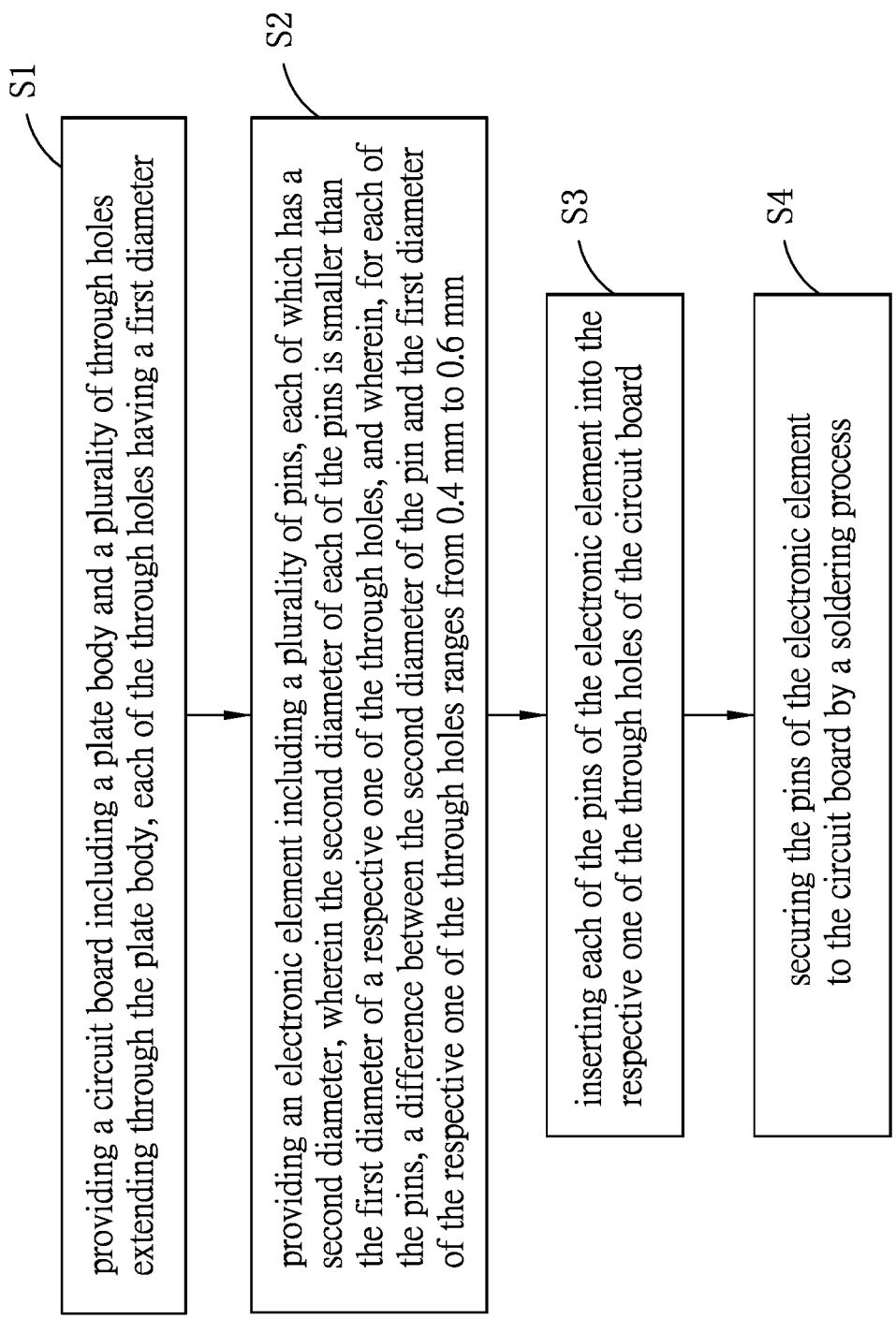
FIG. 3 is a flow chart illustrating steps of a method for manufacturing an embodiment of an electronic device according to the disclosure.
Figure 4:
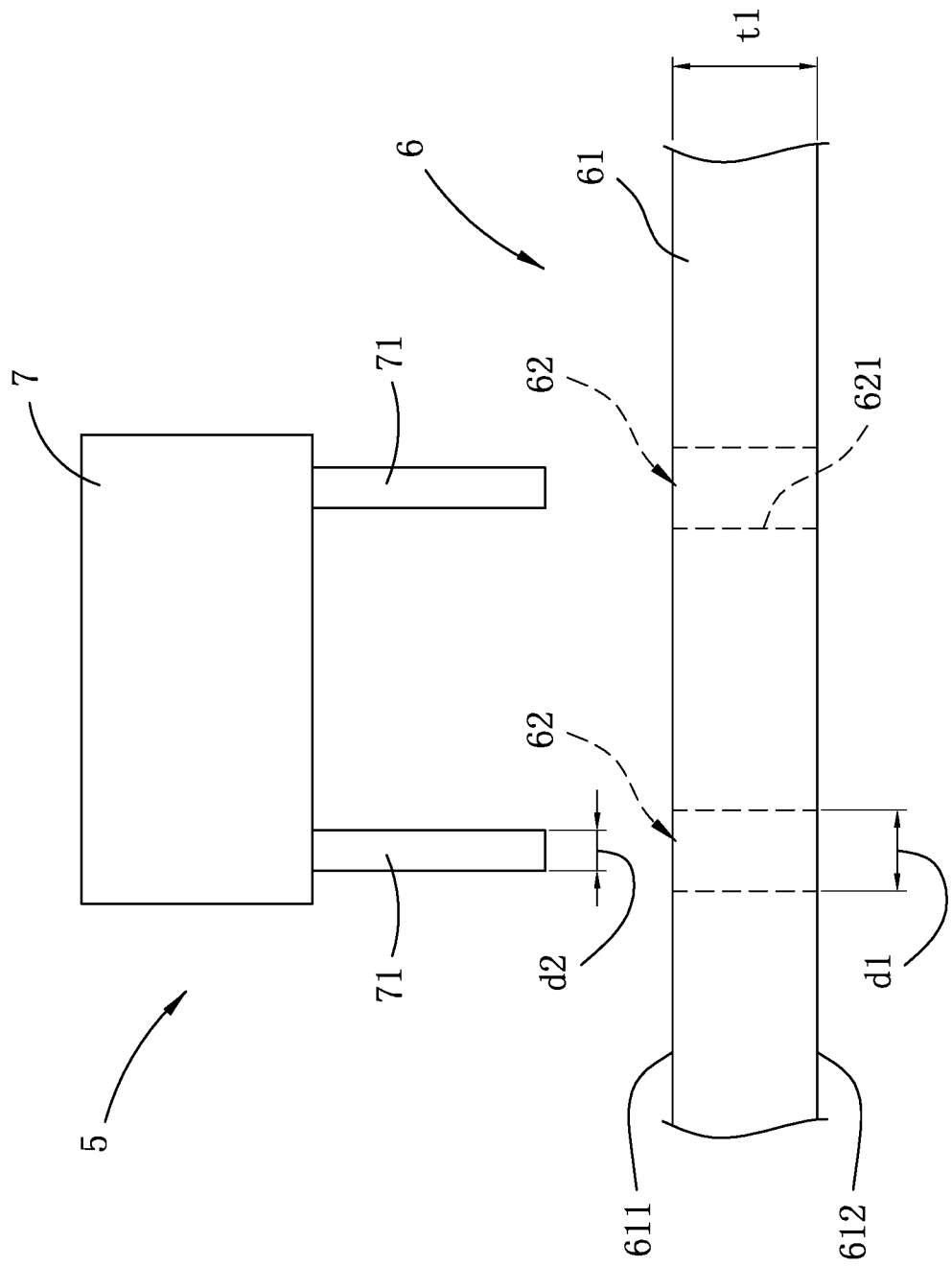
FIG. 4 is a schematic view showing a circuit board and an electronic element of the embodiment before assembly.

In step S1, referring to FIGS. 3 and 4, a circuit board 6 is provided and includes a plate body 61 and a plurality of through holes 62 extending through the plate body 61. Each of the through holes 62 has a first diameter (d1). The plate body 61 has a first surface 611 and a second surface 612 opposite to the first surface 611, and the through holes 62 extend from the first surface 161 to the second surface 162. In one aspect, the plate body 61 has a thickness (t1) that is measured from the first surface 611 to the second surface 612, and that ranges from 1.6 mm to 2 mm. Each of the through holes 62 of the circuit board 6 has a first diameter (d1) and is defined by a hole-defining wall 621. In one aspect, the first diameter (d1) ranges from 0.9 mm to 1.6 mm.

In step S2, still referring to FIGS. 3 and 4, an electronic element 7 is provided and includes a plurality of pins 71, each of which has a second diameter (d2). In one aspect, the second diameter (d2) of each of the pins 71 ranges from 0.45 mm to 1 mm. In this embodiment, the electronic element 7 is illustrated as a capacitor, but may be any one of an active element and a passive element. The second diameter (d2) of each of the pins 71 is smaller than the first diameter (d1) of a respective one of the through holes 62. For each of the pins 71, a diameter difference (d') between the second diameter (d2) of the pin 71 and the first diameter (d1) of the respective one of the through holes 62 ranges from 0.4 mm to 0.6 mm.

Figure 5:
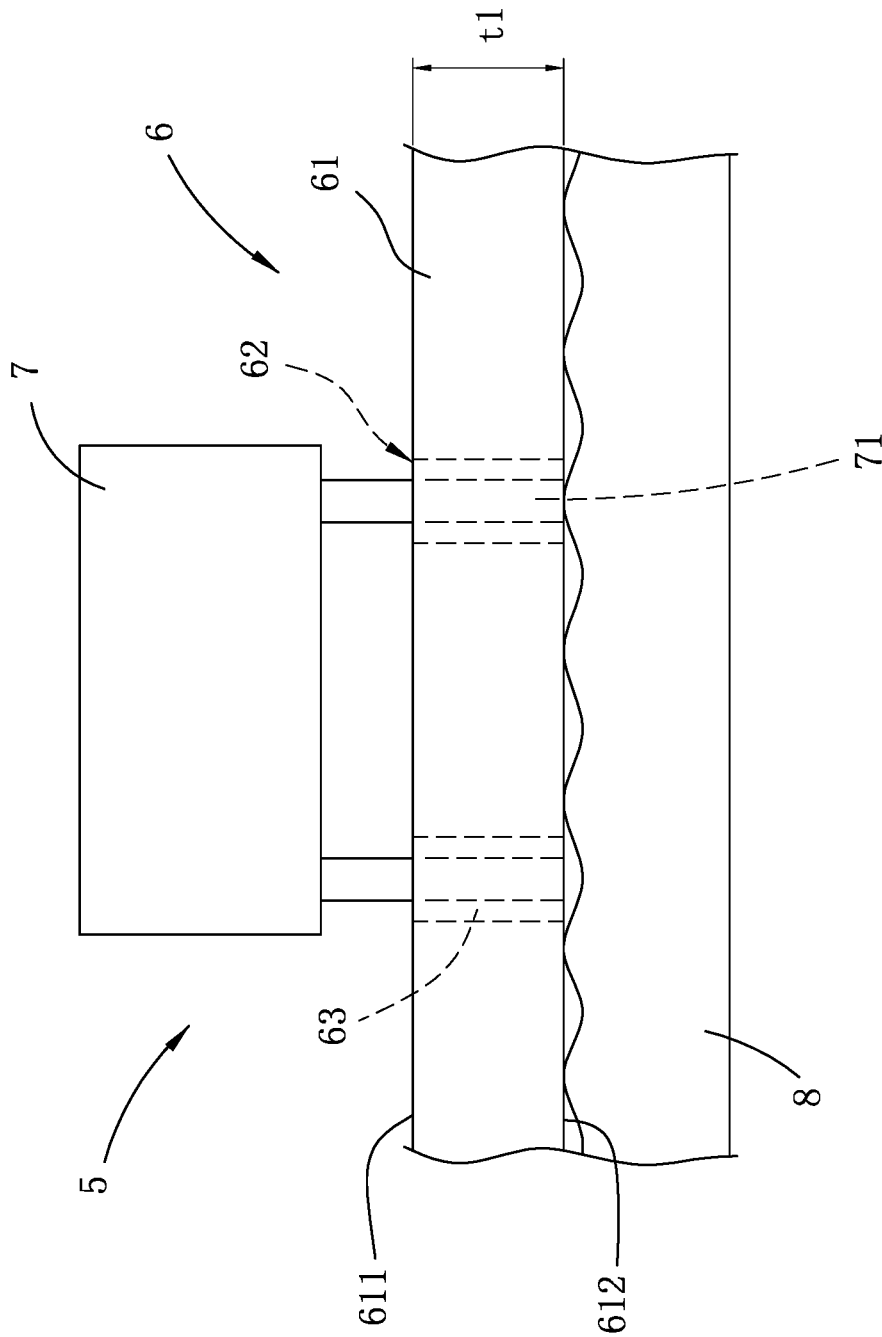
FIG. 5 is a schematic view showing a soldering process for assembling the electronic element and the circuit board of FIG. 4.
Figure 6:
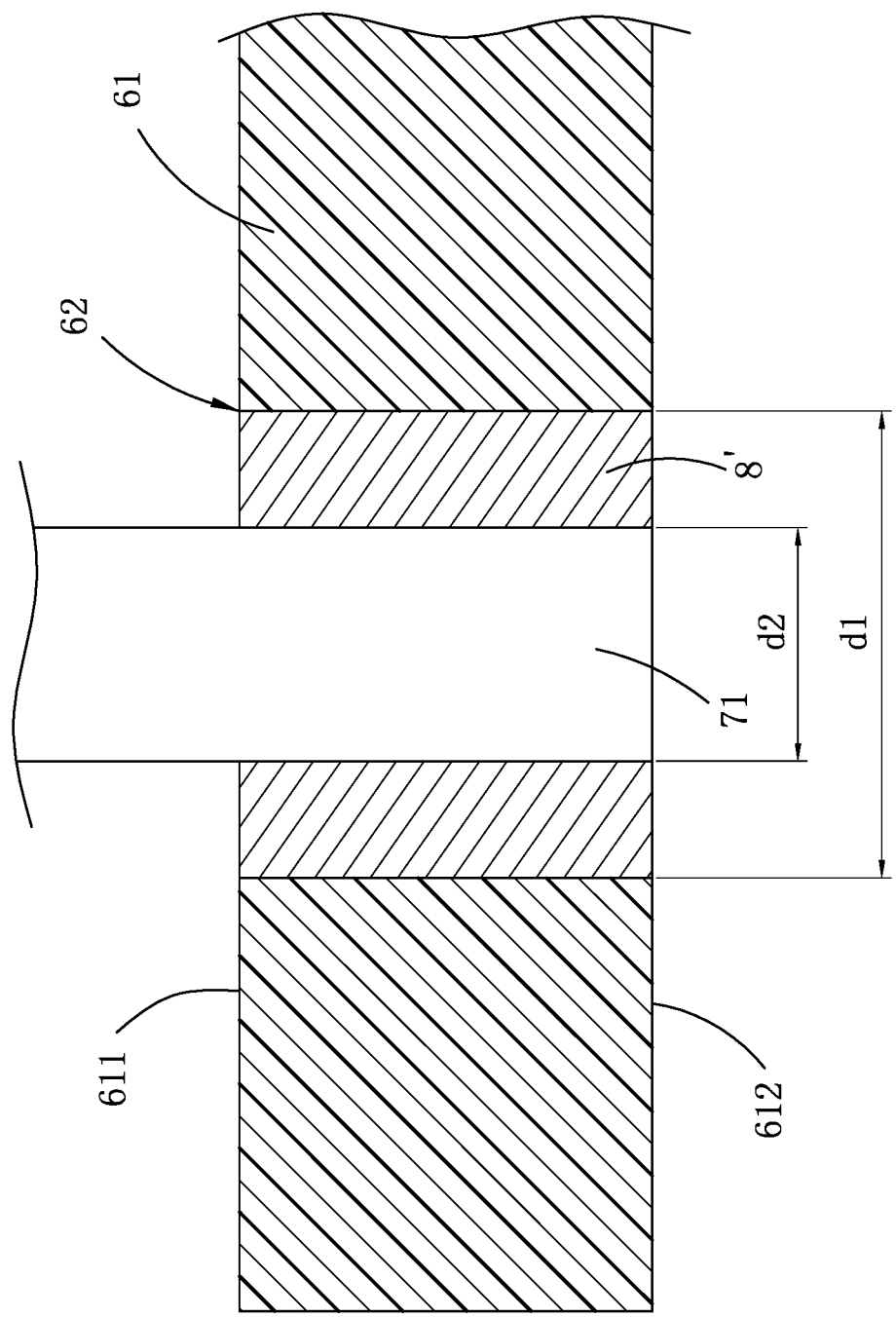
FIG. 6 is a partly and fragmentary sectional view of the embodiment that is free of voids.

In step S3, referring to FIGS. 3 and 5, each of the pins 71 of the electronic element 7 is inserted into the respective one of the through holes 62 of the circuit board 6 in a direction from the first surface 611 to the second surface 612 of the plate body 61, and a gap 63 is formed between a respective one of the pins 71 and the hole-defining wall 621 of the respective one of the through holes 62.

Still referring to FIGS. 3 and 5, in step S4, the pins 71 of the electronic element 7 are secured to the circuit board 6 by a soldering process. In one aspect, the soldering process is illustrated as, but is not limited to, a wave soldering process. In the wave soldering process, a molten solder 8 is contained in a tank (not shown), and the second surface 612 of the plate body 61 on which the electronic elements 7 are mounted is brought into contact with the molten solder 8 such that the molten solder 8 flows into the through holes 62 in which the pins 71 are inserted, fills each of the gaps 63 between the respective one of the pins 71 and the hole-defining wall 621 defining the respective one of the through holes 62 in a direction from the second surface 612 to the first surface 611 of the plate body 61, and surrounds the pins 71. Then, the molten solder 8 is cured by cooling to form a plurality of solder joints 8' that electrically connect and secure the pins 71 of the electronic element 7 to the circuit board 6. In this embodiment, the molten solder 8 can be a lead-free solder, such as a solder made of SAC305 alloy.

Ten experimental examples (i.e., E1 to E10) and ten comparative examples (i.e., CE1 to CE10) were conducted for illustrating the relationship between diameter difference (d, d') of the through holes 62 and the pins 71 and the voids formed in the solder joints 8', and the results are shown in Tables 1 and 2 below.

In each of E1 to E10 and CE1 to CE10, the circuit board 6 may have a thickness (t1) of 1.6 mm or 2 mm, and each of the pins 71 may have a second diameter (d2) of 0.45 mm, 0.5 mm, 0.6 mm, 0.8 mm or 1 mm. In CE1 to CE10, each of the through holes 62 of the circuit board 6 has a first diameter (d1'). As shown in Table 1, the diameter difference (d) between the first diameter (d1') of each of the through holes 62 and the second diameter (d2) of the pins 71 ranges from 0.18 mm to 0.3 mm. In E1 to E10, each of the through holes 62 has the first diameter (d1) that is larger than the first diameter (d1') of the through holes 62 in CE1 to CE10, and the diameter difference (d') between the first and second diameters (d1, d2) ranges from 0.4 mm to 0.6 mm in E1 to E10, while the thickness (t1) of the circuit board 6 and the second diameter (d2) of the pins 71 in E1 to E10 corresponds to those in CE1 to CE10. In each of the CE1 to CE10, the diameter difference (d) is smaller than 0.4 mm, and the void percentage in the solder joints 8' is more than 45%, even reaching 100%, which may adversely affect the reliability of the electronic device 5. In each of the E1 to E10, the diameter difference (d') ranges from 0.4 mm to 0.6 mm and the void percentage in the solder joints 8' is 0% (i.e., no voids in the solder joints 8'), indicating that such range of diameter difference allows gas to easily escape from the molten solder 8 and from the through holes 62.

TABLE 1

Comparative Examples

| Thickness (t1) (mm) | Diameter (d2) (mm) | Items | Diameter (d1') (mm) | Diameter Difference (d) (mm) | Void Precentage (%) |
|---|---|---|---|---|---|
| 1.6 | 0.45 | CE1 | 0.7 | 0.25 | 81.20 |
|  | 0.5 | CE2 | 0.72 | 0.22 | 100.00 |
|  | 0.6 | CE3 | 0.8 | 0.2 | 100.00 |
|  | 0.8 | CE4 | 0.98 | 0.18 | 100.00 |
|  | 1 | CE5 | 1.3 | 0.3 | 47.80 |
| 2 | 0.45 | CE6 | 0.7 | 0.25 | 85.30 |
|  | 0.5 | CE7 | 0.72 | 0.22 | 100.00 |
|  | 0.6 | CE8 | 0.8 | 0.2 | 100.00 |
|  | 0.8 | CE9 | 0.98 | 0.18 | 76.80 |
|  | 1 | CE10 | 1.3 | 0.3 | 65.30 |

TABLE 2

Experimental Examples

| Thickness (t1) (mm) | Diameter (d2) (mm) | Items | Diameter (d1) (mm) | Diameter Difference (d') (mm) | Void Percentage (%) |
|---|---|---|---|---|---|
| 1.6 | 0.45 | E1 | 0.9 | 0.45 | 0.00 |
|  | 0.5 | E2 | 1 | 0.5 | 0.00 |
|  | 0.6 | E3 | 1 | 0.4 | 0.00 |
|  | 0.8 | E4 | 1.3 | 0.5 | 0.00 |
|  | 1 | E5 | 1.45 | 0.45 | 0.00 |
| 2 | 0.45 | E6 | 0.96 | 0.51 | 0.00 |
|  | 0.5 | E7 | 1.1 | 0.6 | 0.00 |
|  | 0.6 | E8 | 1.15 | 0.55 | 0.00 |
|  | 0.8 | E9 | 1.4 | 0.6 | 0.00 |
|  | 1 | E10 | 1.6 | 0.6 | 0.00 |

Figure 7:
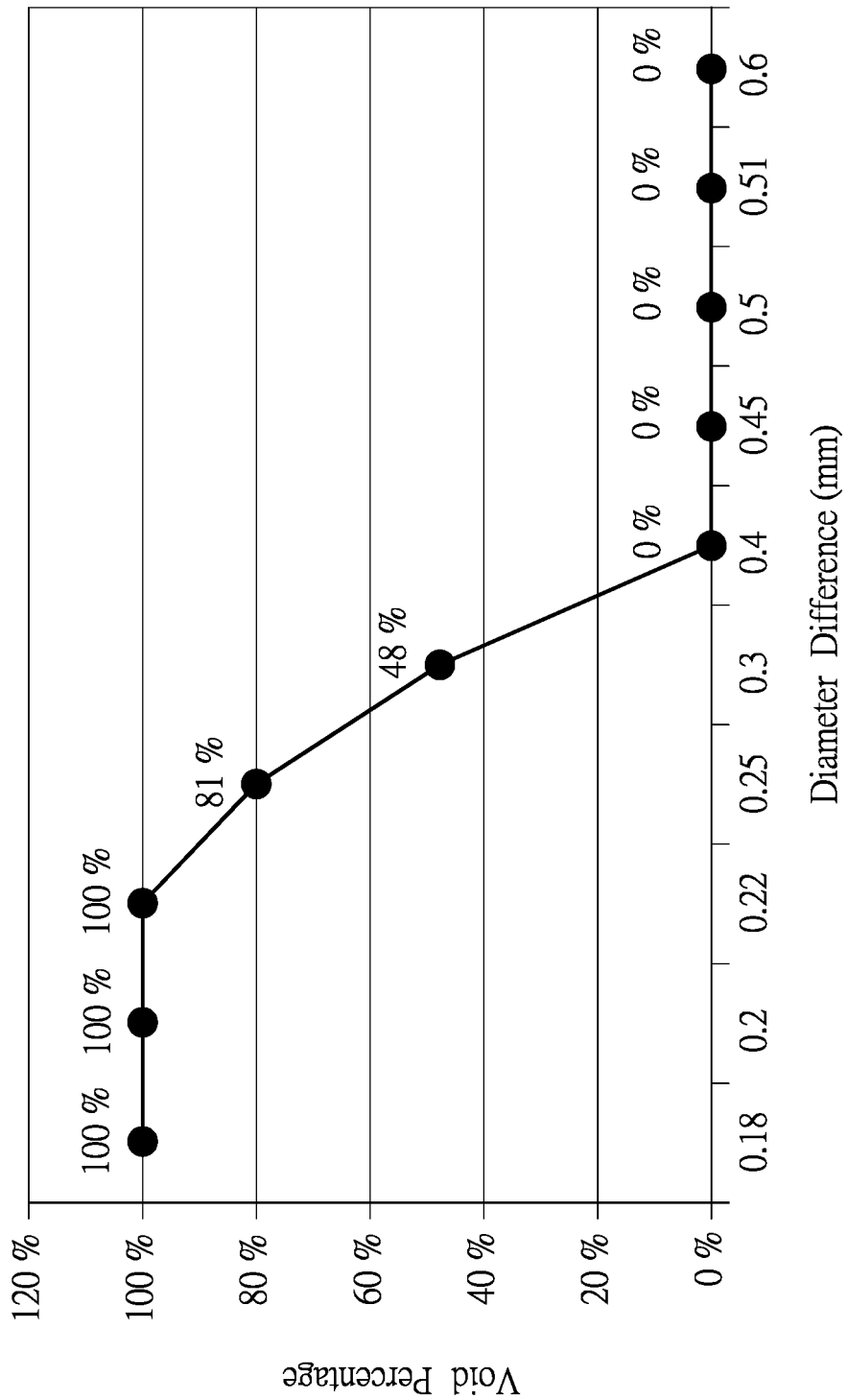
FIG. 7 is a graph showing a relationship between void percentage and a diameter difference between a through hole of the circuit board and a pin of selected experimental examples and comparative examples of this disclosure.

FIG. 7 shows the relationship between the diameter difference (d, d') of the through holes 62 and the pins 71 and the void percentage in the solder joints 8' of results selected from E1 to E10 and CE1 and CE10. As shown in FIG. 7, the solder joints 8' are void-free when the diameter difference (d) is larger than 0.4 mm.

In summary, by virtue of having the diameter difference (d') between the pins 71 and the through holes 62 of the electronic device 5 according to the disclosure, gas can easily escape from the molten solder 8 and the through holes 62 to avoid formation of voids in the solder joints 8' after the molten solder 8 is cooled.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. An electronic device, comprising:
a circuit board including a plate body and a plurality of through holes extending through said plate body, each of said through holes having a first diameter; and
an electronic element including a plurality of pins, each of which is inserted into a respective one of said through holes, is soldered to said circuit board, and has a second diameter smaller than said first diameter of the respective one of said through holes, wherein, for each of said pins, a difference between said second diameter of said pin and said first diameter of the respective one of said through holes ranges from 0.4 mm to 0.6 mm, wherein each of said through holes is defined by a hole-defining wall, said electronic device further comprising a plurality of solder joints, each of which is formed in a gap between a respective one of said pins and said hole-defining wall of a respective one of said through holes to solder the respective one of said pins to said circuit board.

2. The electronic device of claim 1, wherein said first diameter of each of said through holes ranges from 0.9 mm to 1.6 mm.

3. The electronic device of claim 2, wherein said second diameter of each of said pins ranges from 0.45 mm to 1 mm.

4. The electronic device of claim 1, wherein said plate body has a thickness ranging from 1.6 mm to 2 mm.

5. The electronic device of claim 4, wherein said thickness of said plate body is 1.6 mm, said first diameter of each of said through holes ranges from 0.9 mm to 1.45 mm, and said second diameter of each of said pins ranges from 0.45 mm to 1 mm.

6. The electronic device of claim 4, wherein said thickness of said plate body is 2 mm, said first diameter of each of said through holes ranges from 0.96 mm to 1.6 mm, and said second diameter of each of said pins ranges from 0.45 mm to 1 mm.

7. A method for manufacturing an electronic device, comprising the steps of:
providing a circuit board including a plate body having a first surface and a second surface that is opposite to the first surface, and a plurality of through holes extending from the first surface to the second surface, each of the through holes having a first diameter;
providing an electronic element including a plurality of pins, each of the pins having a second diameter smaller than the first diameter of a respective one of the through holes, for each of the pins, a difference between the second diameter of the pin and the first diameter of the respective one of the through holes ranging from 0.4 mm to 0.6 mm;
inserting each of the pins of the electronic element into the respective one of the through holes; and securing the pins of the electronic element to the circuit board by a soldering process, wherein the soldering process is a wave soldering process conducted by contacting the second surface of the plate body with a molten solder such that the molten solder flows into the through holes in which the pins are inserted and surrounds the pins, followed by curing the molten solder to form a plurality of solder joints, each of which electrically connects and secures a respective one of the pins of the electronic element to the circuit board.

8. The method of claim 7, wherein the first diameter of each of the through holes ranges from 0.9 mm to 1.6 mm.

9. The method of claim 7, wherein the second diameter of each of the pins ranges from 0.45 mm to 1 mm.

10. The method of claim 7, wherein the plate body has a thickness ranging from 1.6 mm to 2 mm.

11. The method of claim 10, wherein the thickness of the plate body is 1.6 mm, the first diameter of each of the through holes ranges from 0.9 mm to 1.45 mm, and the second diameter of each of the pins ranges from 0.45 mm to 1 mm.

12. The method of claim 10, wherein the thickness of the plate body is 2 mm, the first diameter of each of the through holes ranges from 0.96 mm to 1.6 mm, and the second diameter of each of the pins ranges from 0.45 mm to 1 mm.

* * * * *